United States Patent
Ichikawa

(10) Patent No.: US 9,847,452 B2
(45) Date of Patent: Dec. 19, 2017

(54) LIGHT EMITTING DEVICE, AND METHOD FOR MANUFACTURING THEREOF

(71) Applicant: Nichia Corporation, Anan-shi (JP)

(72) Inventor: Masatsugu Ichikawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/523,676

(22) Filed: Oct. 24, 2014

(65) Prior Publication Data

US 2015/0115278 A1    Apr. 30, 2015

(30) Foreign Application Priority Data

Oct. 28, 2013  (JP) .................. 2013-223628
Oct. 15, 2014  (JP) .................. 2014-210758

(51) Int. Cl.

| H01L 33/00 | (2010.01) |
|---|---|
| H01L 33/22 | (2010.01) |
| H01L 33/50 | (2010.01) |
| H01L 33/52 | (2010.01) |
| H01L 33/58 | (2010.01) |
| H01L 33/54 | (2010.01) |

(52) U.S. Cl.
CPC .......... *H01L 33/22* (2013.01); *H01L 33/0079* (2013.01); *H01L 33/50* (2013.01); *H01L 33/54* (2013.01); *H01L 33/58* (2013.01); *H01L 2224/14* (2013.01); *H01L 2224/16225* (2013.01); *H01L 2924/181* (2013.01); *H01L 2933/0041* (2013.01); *H01L 2933/0058* (2013.01)

(58) Field of Classification Search
CPC ................... H01L 33/22; H01L 33/20
USPC .................. 257/76, 98; 438/29
See application file for complete search history.

(56) References Cited

U.S. PATENT DOCUMENTS

| 2010/0032701 | A1* | 2/2010 | Fudeta ............................ 257/98 |
|---|---|---|---|
| 2010/0084679 | A1* | 4/2010 | Hsieh et al. ................... 257/98 |
| 2010/0314650 | A1 | 12/2010 | Sugimori |
| 2010/0320479 | A1* | 12/2010 | Minato ................ H01L 33/505 257/88 |
| 2011/0204324 | A1* | 8/2011 | Kim ............................... 257/13 |
| 2012/0081671 | A1* | 4/2012 | Awanohara .......... G02B 27/285 353/20 |
| 2012/0132944 | A1* | 5/2012 | Hsieh ..................... H01L 33/46 257/98 |
| 2012/0138984 | A1 | 6/2012 | Kamiya et al. |

(Continued)

FOREIGN PATENT DOCUMENTS

| JP | 2010-287687 A | 12/2010 |
|---|---|---|
| JP | 2011-009305 A | 1/2011 |

(Continued)

*Primary Examiner* — Moazzam Hossain
(74) *Attorney, Agent, or Firm* — Foley & Lardner LLP

(57) ABSTRACT

Provided is a light emitting device comprising an optical member provided on a light extracting surface side of a semiconductor light emitting element via a first light transmissive layer, wherein bonding surfaces of the semiconductor light emitting element and the first light transmissive layer are roughened surfaces, bonding surfaces of the first light transmissive layer and the optical member are flat, and the first light transmissive layer and the optical member are directly bonded.

11 Claims, 11 Drawing Sheets

(56) References Cited

U.S. PATENT DOCUMENTS

| | | | |
|---|---|---|---|
| 2012/0228656 A1* | 9/2012 | Kamiyama | H01L 33/22 257/98 |
| 2012/0292631 A1* | 11/2012 | Katsuno | H01L 33/62 257/76 |
| 2012/0305942 A1* | 12/2012 | Lo | H01L 33/007 257/77 |
| 2013/0026527 A1 | 1/2013 | Ichikawa | |
| 2013/0069104 A1 | 3/2013 | Ichikawa | |
| 2013/0075771 A1* | 3/2013 | Fujimoto | H01L 33/30 257/96 |
| 2013/0119424 A1* | 5/2013 | Kang et al. | 257/98 |
| 2013/0146928 A1* | 6/2013 | Inoue et al. | 257/98 |
| 2013/0248917 A1* | 9/2013 | Obata | H01L 33/38 257/99 |
| 2013/0256727 A1* | 10/2013 | Higuchi | H01L 33/44 257/98 |
| 2013/0341591 A1* | 12/2013 | Chen | 257/13 |
| 2014/0001508 A1* | 1/2014 | Tasaki | H01L 33/405 257/98 |
| 2014/0191243 A1* | 7/2014 | Singh et al. | 257/76 |
| 2014/0252388 A1* | 9/2014 | Kimura | H01L 33/502 257/98 |
| 2015/0155426 A1* | 6/2015 | Jeon | H01L 33/46 438/29 |
| 2015/0221693 A1* | 8/2015 | Saitou | H01L 27/14627 257/432 |
| 2015/0301257 A1* | 10/2015 | Choi | C09K 11/025 362/607 |

FOREIGN PATENT DOCUMENTS

| | | |
|---|---|---|
| JP | 2012-124219 A | 6/2012 |
| JP | 2012-142326 A | 7/2012 |
| WO | WO-2011/126000 A1 | 10/2011 |
| WO | WO-2011/152262 A1 | 12/2011 |

* cited by examiner

LIGHT EMITTING DEVICE, AND METHOD FOR MANUFACTURING THEREOF

CROSS REFERENCE TO RELATED APPLICATIONS

The present application claims priority to Japanese Application No. 2013-223628, filed Oct. 28, 2013 and Japanese Application No. 2014-210758, filed Oct. 15, 2014 the disclosures of which are hereby incorporated by reference in their entirety.

BACKGROUND OF THE INVENTION

Field of the Invention

The present disclosure relates to a light emitting device which uses a semiconductor light emitting element, and a method for manufacturing thereof.

Description of the Related Art

A semiconductor light emitting element (or a light emitting diode; LED) has the following features in comparison with an electric light bulb: a) a response speed for turning on and turning off is faster, b) a length of life is 50th to 100th times longer, and c) an electric power consumption is about ⅓ to about 1/15. By applying such features, a light emitting device which uses the semiconductor light emitting element is utilized in a very wide range of fields such as a back light of a liquid crystal display, an outdoor full color display, a toy, a general lighting, a light source for reading and/or writing of an optical recording medium, a light source for optical communication and the like. It is also expected to facilitate energy saving by using the LED, and currently, study and development of the LED is energetically performed, aiming at raising luminance, efficiency or the like. In particular, relating to the light emitting devices for automobile use, and for general lighting use, the demand for a high luminance, a high efficiency and a low electric power consumption is very strong.

Under such circumstances, an invention for enhancing a light extracting efficiency from a light emitting device is described in JP2012-124219A. In JP2012-124219 A, there is disclosed an invention relating to a semiconductor light emitting element which has a semiconductor laminated structure having a light emitting layer placed between a first conductive type layer (an n-type semiconductor layer) and a second conductive type layer (a p-type semiconductor layer), and in which a light is extracted from the first conductive type layer side of a light emitting layer. In the light emitting device according to JP2012-124219A, a surface (a light extracting surface) of the first conductive type layer, which surface is opposite to another surface which contacts the light emitting layer is roughened to suppress total reflection of the light emitted from the light emitting layer, resulting in enhancement of light extracting efficiency.

As described in the JP2012-124219A, the light emitting device in which the light extracting surface of the first conductive type layer is roughened might be one preferred embodiment for enhancing the light extracting efficiency.

SUMMARY OF THE INVENTION

However, when the light extracting surface of the first conductive type layer is roughened, there is a problem that the light emitting element cannot be bonded to an optical member such as a lens, a wavelength converting member or the like while keeping the enhanced light extracting efficiency. In other words, if the optical member is connected onto the roughened first conductive type layer, a void (that is, a layer of air having a low refractive index) is generated at boundary faces between them because the surface of the first conductive type layer is roughened. If the void exists, a partial or total reflection of the light (hereinafter, simply called "total reflection") is caused by the Fresnel reflection due to difference in a refractive index between the first conductive type layer and air, leading to suppression of the light extracting efficiency. While the void is not generated by connecting the first conductive type layer and the optical member with using an adhesive agent, the total reflection is likely to be generated to reduce the light extracting efficiency at each boundary face thereof because the refractive indexes of the first conductive type layer, the adhesive agent and the optical member are different from each other.

One aspect of the present invention is made to overcome the above-mentioned conventional problem, and aims at providing a light emitting device having an enhanced light extracting efficiency, and a method for manufacturing the same.

A light emitting device according to one aspect of the present invention is a light emitting device comprising an optical member provided on a light extracting surface side of a semiconductor light emitting element via a first light transmissive layer, wherein, bonding surfaces of said semiconductor light emitting element and said first light transmissive layer are roughened surfaces;

bonding surfaces of said first light transmissive layer and said optical member are flat; and said first light transmissive layer and said optical member are directly bonded.

A method for manufacturing a light emitting device according to another aspect of the present invention is a method for manufacturing a light emitting device comprising an optical member provided on a light extracting surface side of a semiconductor light emitting element via a first light transmissive layer, the method comprising the steps of:

(i) roughening a light extracting surface of said semiconductor light emitting element;

(ii) forming said first light transmissive layer on said roughened light extracting surface;

(iii) flattening an upper surface of said first light transmissive layer; and (iv) directly bonding said flattened upper surface of said first light transmissive layer and a surface of said optical member.

BRIEF DESCRIPTION OF THE DRAWINGS

FIG. 4 is a schematic sectional view describing a phenomenon observed when a light emitting element and an optical member are connected with using a resin material such as an adhesive agent or the like.

DETAILED DESCRIPTION OF THE EMBODIMENTS

A light emitting device and a method for manufacturing thereof according to embodiments of the present invention will be described accordingly, with referring to the accompanying drawings.

(Light Emitting Device)

At first, a light emitting device according to the embodiment will be described with referring to FIG. 1.

Figure 1:
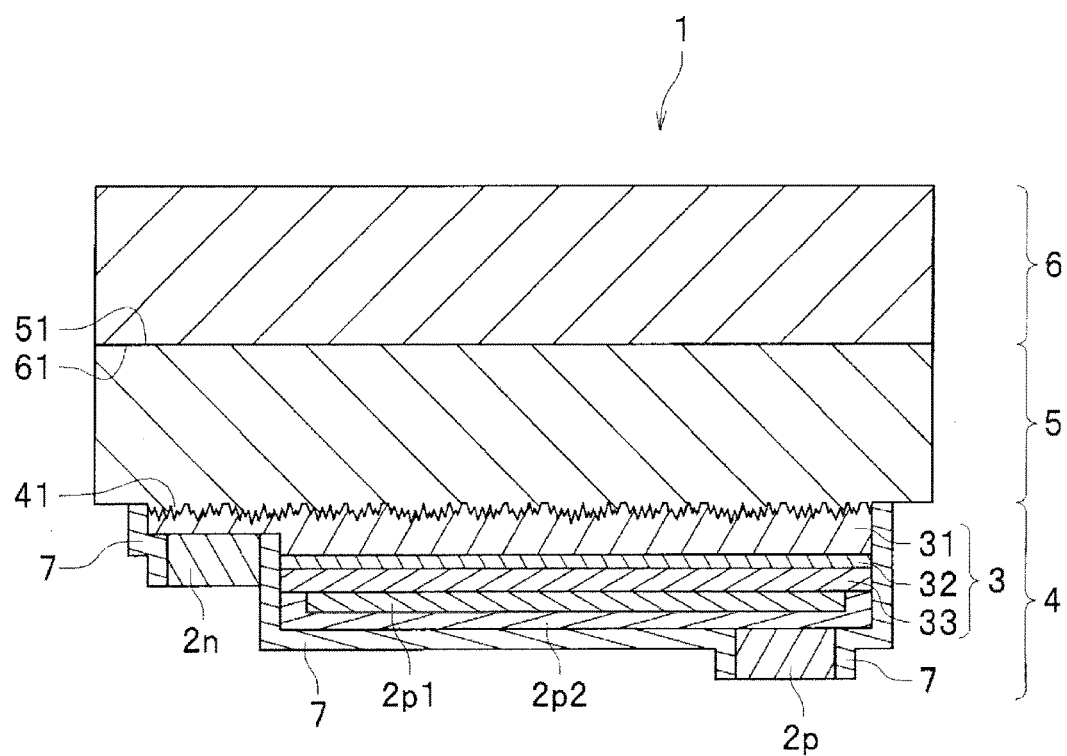
FIG. 1 is a schematic sectional view of a light emitting device according to an embodiment of the present invention.

The light emitting device illustrated in FIG. 1 is an example of an LED chip for flip-chip mounting (face-up mounting) in which an n-side electrode 2n and a p-side electrode 2p are provided on one surface side of a semiconductor stack 3. In FIG. 1, the light emitting device 1 is flip-chip mounted such that a surface on which the n-side electrode 2n and the p-side electrode 2p are formed (hereinafter called "the electrode forming surface") faces downward, and a light is emitted upward from a surface which is opposite to the electrode forming surface of the semiconductor stack 3. The technical idea of the present disclosure is, however, not limited to the above construction, and can be applied to the light emitting device 1 for wire mounting (face-up mounting).

As illustrated in FIG. 1, the light emitting device 1 includes a semiconductor light emitting element 4 (hereinafter, simply called "light emitting element 4"), a first light transmissive layer 5, and an optical member 6.

More specifically, the light emitting device 1 includes the optical member 6 which is provided on a light extracting surface 41 side of the light emitting element 4 via the first light transmissive layer 5. Thus, the light emitting device 1 is configured such that the first light transmissive layer 5 and the optical member 6 are laminated in this order on the light extracting surface 41 of the light emitting element 4. In the present embodiment, bonding surfaces of the light emitting element 4 and the first light transmissive layer 5 are roughened surfaces, and bonding surfaces of the first light transmissive layer 5 and the optical member 6 are flattened surfaces. In the specification, the "light extracting surface" means a surface of the semiconductor stack 3, which surface is opposite to the surface on which the n-side electrode 2n and the p-side electrode 2p are formed (an upper surface of the n-type semiconductor layer 31 in FIG. 1.) The "bonding surface(s)" means comprehensively surfaces of two different objects (for example, elements or members) at a bonding portion where the surfaces of the two objects are bonded. Therefore, the "bonding surfaces of the light emitting element and the first light transmissive layer" indicate both the surface of the light emitting element and the surface the first light transmissive layer, and the "bonding surfaces of the first light transmissive layer and the optical member" indicate both the surface of the first light transmissive layer and the surface of the optical member.

(Light Emitting Element)

The light emitting element 4 includes the semiconductor stack 3, the n-side electrode 2n and the p-side electrode 2p. The light emitting element 4 emits a light by recombination of electrons and positive holes provided from the n-side electrode 2n and the p-side electrode 2p respectively in the semiconductor stack 3. The semiconductor stack 3 as illustrated in FIG. 1 is configured such that a n-type semiconductor layer 31, an active layer 32, and a p-type semiconductor layer 33 are laminated in this order from the light extracting surface 41 of the light emitting element 4. The active layer 32 is also called a light emitting layer, and the active layer 32 may be formed optionally. The n-type semiconductor layer 31 is connected to the n-side electrode 2n, and the p-type semiconductor layer 33 is connected to the p-side electrode 2p.

The layers forming the semiconductor stack 3 may be preferably obtained, for example, by epitaxially growing the n-type semiconductor layer 31, the active layer 32, and the p-type semiconductor layer 33 in this order on a growth substrate such as sapphire. All of these layers are preferably formed of one or more elected form the group consisting of GaN, GaAs, InGaN, AlInGaP, GaP, SiC, ZnO and the like. In particular, for these layers, it is preferable to use a GaN compound which is represented by a general formula $In_X Al_Y Ga_{1-X-Y}N$ ($0 \leq X$, $0 \leq Y$, $X+Y<1$).

Each of the n-type semiconductor layer 31, the active layer 32 and the p-type semiconductor layer 33 may have a single layer construction, a layered construction composed of two or more layers which have different compositions and film thicknesses, a superlattice construction or the like, In particular, the active layer 32 preferably has a single quantum well structure or a multiple quantum well structure, which includes a thin membrane generating the quantum effect. In such a quantum well structure, the well layer is preferably a nitride semiconductor including "In".

As illustrated in FIG. 1, the light extracting surface 41 of the light emitting element 4 is a surface on the side which does not contact the active layer 32, in the n-type semiconductor layer 31. As mentioned above, the n-type semiconductor layer 31 may be formed using GaN or the like. Since a refractive index of GaN is so high such as about 2.5, total reflection is likely to be generated at the boundary face between the light extracting surface 41 and the outside when a light is extracted from the light extracting surface 41. Therefore, as mentioned above, the light extracting surface 41 (the surface which contacts the first light transmissive layer) is roughened in this light emitting element 4. According to such construction, the light extracted from the light extracting surface 41 can be scattered, and thereby suppressing the total reflection. Consequently, the light extracting efficiency of the light emitting device 1 can be enhanced. Also opportunities of the multiple reflection in the semiconductor stack 3 can be reduced, whereby the light extracting efficiency of the light emitting device 1 can be further enhanced. Judgment whether the light extracting surface 41 is a roughened surface or not is made according to the comparison whether the light extracting surface 41 is rougher than the below-mentioned bonding surfaces of the first light transmissive layer 5 and the optical member 6, or not.

The light extracting surface 41 may be roughened with a wet process (a wet etching) with using an alkaline solution or the like, or a dry process (a dry etching). The light extracting surface 41 may be roughened by forming dotted patterns or line and space patterns. The light extracting surface 41 may also be roughened by combining the pattern formation with the wet process or the dry process.

The roughened surface may be configured such that convex portions or concave portions whose dimensions and shapes are not constant are formed, or such that convex portions or concave portions whose dimensions and shapes are constant are placed randomly or in regularly. The light extracting surface 41 is a roughened surface whose arithmetic average roughness Ra is preferably greater than 50 nm, and more preferably greater than 150 nm. The arithmetic average roughness Ra can be determined according to the JIS B0601-2001.

In FIG. 1, the n-side electrode 2n and the p-side electrode 2p are located apart from each other with a predetermined distance to avoid electrical connection, on the lower side of the semiconductor stack 3. Thus, the n-side electrode 2n and the p side electrode 2p are provided independently from each other.

The n-side electrode 2n and the p-side electrode 2p are formed of a metal electrode material, similarly to a conventional light emitting element. The metal electrode material is, for example, at least one or alloy thereof selected from the group consisting of for example, Au, Cu, Ni, Al, Pt, Cr, Rh and the like. Each of the n-side electrode 2n and the p-side electrode 2p may be formed in a single layer or a multilayered film. Both of the n-side electrode 2n and the p-side electrode 2p may be formed as a multilayered film in which a Cu single layer or a Cu/Ni layered film is placed as a lower layer and Au or AuAs alloy is formed thereon as an upper layer. Each of the n-side electrode 2n and the p-side electrode 2p may be formed by sputtering, vapor deposition or the like.

The p-side electrode 2p is preferably connected to the p-type semiconductor layer 33 via the whole-area electrode 2p1 which diffuses an electric current in in-plane uniform manner toward the p-type semiconductor layer 33. Accordingly, it is preferable that the whole-area electrode 2p1 is an ohmic electrode which can give a good electrical connection to the p-type semiconductor layer 33. The whole-area electrode 2p1 also functions as a reflective layer to reflect a light emitted by the semiconductor stack 3 toward the light extracting surface 41. Therefore, the whole-area electrode 2p1 is preferably formed of a material which has a high reflectance at least relative to the wavelength of the light emitted by the active layer 32. The whole-area electrode 2p1 is preferably a single layer film which is formed of Ag or alloy thereof which has a high reflectance relative to the light, or a multilayered film in which a film of the abovementioned Ag or alloy thereof is placed as a lowest layer, and a film formed of Ni and/or Ti or the like is provided thereon.

In particular, when Ag is used for a material of the whole-area electrode 2p1, it is preferable to provide a covering electrode 2p2 which covers the whole-area electrode 2p1. The covering electrode 2p2 diffuses an electric current in the entire surface of the p-type semiconductor layer 33, similarly to the whole-area electrode 2p1. Further, the covering electrode 2p2 covers an upper surface and side surfaces of the whole-area electrode 2p1 to block off the whole-area electrode 2p1, and thereby preventing the contact between the whole-area electrode 2p1 and the p-side electrode 2p. In other words, the covering electrode 2p2 functions as a barrier layer for preventing the migration of the material of the whole-area electrode 2p1, especially Ag. The covering electrode 2p2 is formed of, for example, one kind of metal or alloy thereof selected from the group consisting of Ti, Au, W, Al, Cu and the like. The covering electrode 2p2 may be a single layer film or a multilayered film. Specifically, the covering electrode 2p2 may be a single layer film formed of AlCu alloy, AlCuSi alloy or the like, or a multilayered film including such a film. Each of the whole-area electrode 2p1 and the covering electrode 2p2 may be formed by sputtering, vapor deposition or the like.

In the light emitting element 4, an exposed surface of the side where the electrodes are formed is preferably covered with a protecting layer 7, except for the end surfaces of the n-side electrode 2n and the p-side electrode 2p. In the light emitting element configured in the above-mentioned manner, the protecting layer 7 is, in particular, formed on the surface of the semiconductor stack 3, on the upper surface of the covering electrode 2p2, at the periphery of the n-side electrode 2n, and at the periphery of the p-side electrode 2p. It is preferable that the protecting layer 7 is formed of, for example, at least one selected from the group consisting of oxides of Si, Ti, Ta, Nb, Zr, Mg and the like (for example, $SiO_2$, $TiO_2$, $Ta_2O_2$, $Nb_2O_5$, $ZrO_2$, MgO), a Si nitride (for example, $Si_3N_4$), a nitride such as AlN etc., a magnesium fluoride $MgF_2$ and the like. In the case of using the above-mentioned materials, the protecting layer 7 may be formed by sputtering, vapor deposition or the like.

(First Light Transmissive Layer)

A first light transmissive layer 5 is formed on the upper surface 31 of the n-type semiconductor layer 31 of the semiconductor stack 3, that is, on the light extracting surface 41 of the light emitting element 4. The first light transmissive layer 5 may have dielectric property. The first light transmissive layer 5 propagates a light extracted from the light extracting surface 41 in the layer and emits the light from a surface of the opposite side (this surface may be called "light emitting surface 51" in the specification).

The first light transmissive layer 5 is preferably formed of, for example, at least one inorganic dielectric material selected from the group consisting of $SiO_2$, SiON, $TiO_2$ and $Al_2O_3$, or an organic-inorganic hybrid material containing at least one selected from the group consisting of $SiO_2$, SiON, $TiO_2$ and $Al_2O_3$ as an inorganic component. The above-mentioned inorganic dielectric material may be formed by CVD (Chemical Vapor Deposition), sputtering, vapor deposition, ALD (Atomic Layer Deposition) or the like. Examples of the organic component used in the organic-inorganic hybrid material include polyethylene, polypropylene, polystyrene, nylon, polycarbonate, polyethylene terephthalate, polyimide and the like. The organic-inorganic hybrid material may be formed by a sol-gel process, an in-situ polymerisation process, a solid-phase reaction method or the like. While the preferred materials for the first light transmissive layer 5 are exemplified above, the material for the first light transmissive layer 5 is not limited to them. For example, the first light transmissive layer 5 may be formed of any material having a light transmissive property relative to the wavelength of the light emitted by the light emitting element 4, and having the refractive index that is almost the same as that of the optical member 6 to which the first light transmissive layer 5 is bonded.

Since the first light transmissive layer 5 after being formed is flattened by polishing, it is preferable that the layer 5 is formed to have a thickness enough to exceed a concavo-convex portion of the n-type semiconductor layer 31 existing before the layer 5 is formed. In other words, the first light transmissive layer 5 is preferably formed with the thickness enough to cover the concavo-convex portion of the light extracting surface 41 so that the concavo-convex portion dose not appear on a surface of the layer 5. The thickness of the first light transmissive layer 5 may be, for example, 100 nm to 1000 nm.

A refractive index of the first light transmissive layer 5 is preferably at the same level as that of the refractive index of the semiconductor stack 3 which contacts the first light transmissive layer 5, or at the same level as that of the refractive index of the optical member 6. If the refractive index of the first light transmissive layer 5 is the same as the refractive index either of the layer or the member which is in contact with the first light transmissive layer 5, the refractive-index boundaries can be reduced. Accordingly, it is possible to reduce the total reflection which is generated at the boundary face between the semiconductor stack 3 and the first light transmissive layer 5, or at the boundary face between the first light transmissive layer 5 and the optical member 6, and thereby enhancing light extracting efficiency. The "at the same level" means, for example, that difference in refractive index between the first light transmissive layer 5 and the semiconductor stack 3 or the optical member 6 is within a range of ±0.3 based on an absolute value, preferably within a range of ±0.1, and further preferably within a range of ±0.05.

As the difference in refractive index between the first light transmissive layer 5 and the semiconductor stack 3 is smaller, the refraction of the light emitted from the light emitting element 4 is less likely to arise and therefore the effect given by roughening the light extracting surface 41 is less likely to be obtained. On the other hand, since the first transmissive layer 5 and the optical member 6 are directly bonded to form a relative flat interface, the light extracting efficiency may be reduced due to the influence of refraction when the difference in refractive index between both layers is large. For these reasons, the refractive index of the first light transmissive layer 5 is more preferably at the same level as the refractive index of the optical member 6.

Specifically, the refractive index of the first light transmissive layer 5 may be about 1.4 to about 2.0, especially about 1.6 to about 2.0. If the refractive index of the first light transmissive layer 5 is within this range, the total reflection generated in any of the above-mentioned boundary faces can be suppressed more certainly, and thereby enhancing the light extracting efficiency more certainly. If the refractive index of the first light transmissive layer 5 exceeds 2.0, there is a case that it is difficult to enhance the light extracting efficiency since a light tends to be absorbed more. The refractive index of the first light transmissive layer 5 can arbitrarily be adjusted according to the selection of the material, the condition to form the layer and the like, with considering the light transmittance. The refractive index of SiO (specifically, for example $SiO_2$) is 1.41, the refractive index of SiN (specifically, for example $Si_3N_4$) is 2.0, and the refractive index of SiON (also generally called $SiO_xN_y$) is between the above-mentioned values. Accordingly, when the first light transmissive layer 5 is formed by CVD or the like, by adequately setting a content ratio of Si, O and N, it is possible to make the refractive index at the same level as that of the refractive index of the semiconductor stack 3, or at the same level as that of the refractive index of the optical member 6.

The light emitting surface 51 of the first light transmissive layer 5 is bonded to a surface 61 of the optical member 6. The bonding of these surfaces is preferably performed by direct bonding. In the present specification, the "direct bonding" or "directly bonded" means bonding without application of an adhesive agent or another resin. Examples of the direct bonding include surface-activated bonding, atomic diffusion bonding, hydroxyl bonding or the like. One of the above-mentioned methods may be selected and utilized when the light emitting surface 51 and the surface 61 are bonded. All of these bondings can be performed by a normal temperature bonding method performed under the normal temperature.

The surface-activated bonding is a method wherein an impurity such as an oxide, moisture, an organic substance or the like, which is attached to surfaces of members that are objects to be bonded, is removed together with a part of the surface layer thereof, and then bonding hands of atoms on the surfaces are bonded directly under the normal temperature. This method is disclosed in WO 2011/126000, which is incorporated by reference in its entirety.

The atomic diffusion bonding is a method wherein a micro crystal film such as Al or the like is formed on each of the surfaces of members which are objects to be bonded (that is, surfaces which become bonding surfaces after bonding) under the super high vacuum condition, and then the formed thin films are bonded by lamination under the vacuum condition.

The hydroxyl bonding is a method wherein each of the surfaces of members that are objects to be bonded is subjected to a hydrophilicizing treatment to form a hydroxyl group (OH group) thereon, and the surfaces are brought into contact with each other to bond hydroxyl groups by hydrogen bonding.

Figure 2:
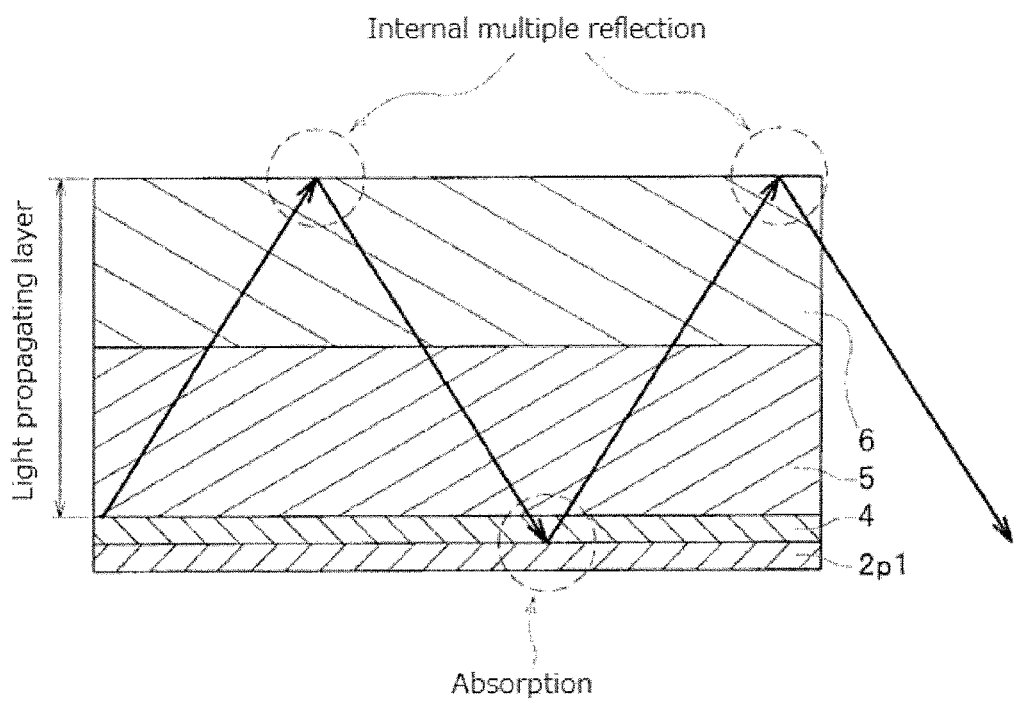
FIG. 2 is a schematic sectional view describing relationship among propagation of a light, internal multiple reflection of a light and absorption of a light when a first light transmissive layer is formed.
Figure 3:
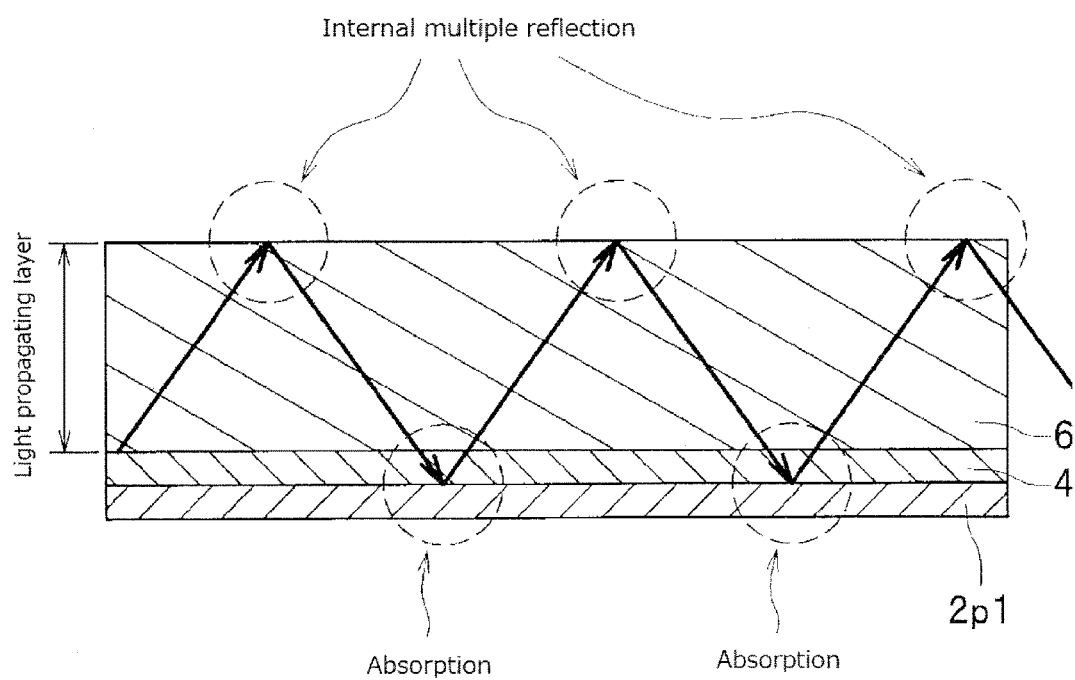
FIG. 3 is a schematic sectional view describing relationship among propagation of a light, internal multiple reflection of a light and absorption of a light when a first light transmissive layer is not formed.

If the first light transmissive layer 5 and the optical member 6 are directly bonded, the first light transmissive layer 5 and the optical member 6 can be bonded strongly. Further, as understood from FIG. 2 and FIG. 3, the thickness of the light propagating layer can be increased by forming the first light transmissive layer 5. Consequently, in the light emitting device 1, it is possible to reduce opportunities for absorption of the light by the electrodes when internal multiple reflections occur, and thereby enhancing the light extracting efficiency.

When the first light transmissive layer 5 and the optical member 6 are directly bonded, it is not necessary to use a resin, such as an adhesive agent, of which refractive index is significantly different from those of the layer 5 and the member 6. Since refractive index of the resin such as the adhesive agent or the like is about 1.43 to 1.53, the total reflection is likely to arise at the boundary face between a resin 8 and the light emitting element 4 (see FIG. 4). On the contrary, the present embodiment prevents the generation of the total reflection by directly bonding the first light transmissive layer 5 and the optical member 6 in order to avoid substantial interposition of the adhesive layer such as the resin 8 or the like. In the light emitting device 1, since the resin material such as the adhesive agent or the like is not used, difference in the refractive index between the semiconductor stack 3 and the optical member 6 can be reduced. Therefore, the light emitting device 1 can enhance the light extracting efficiency.

Figure 4:
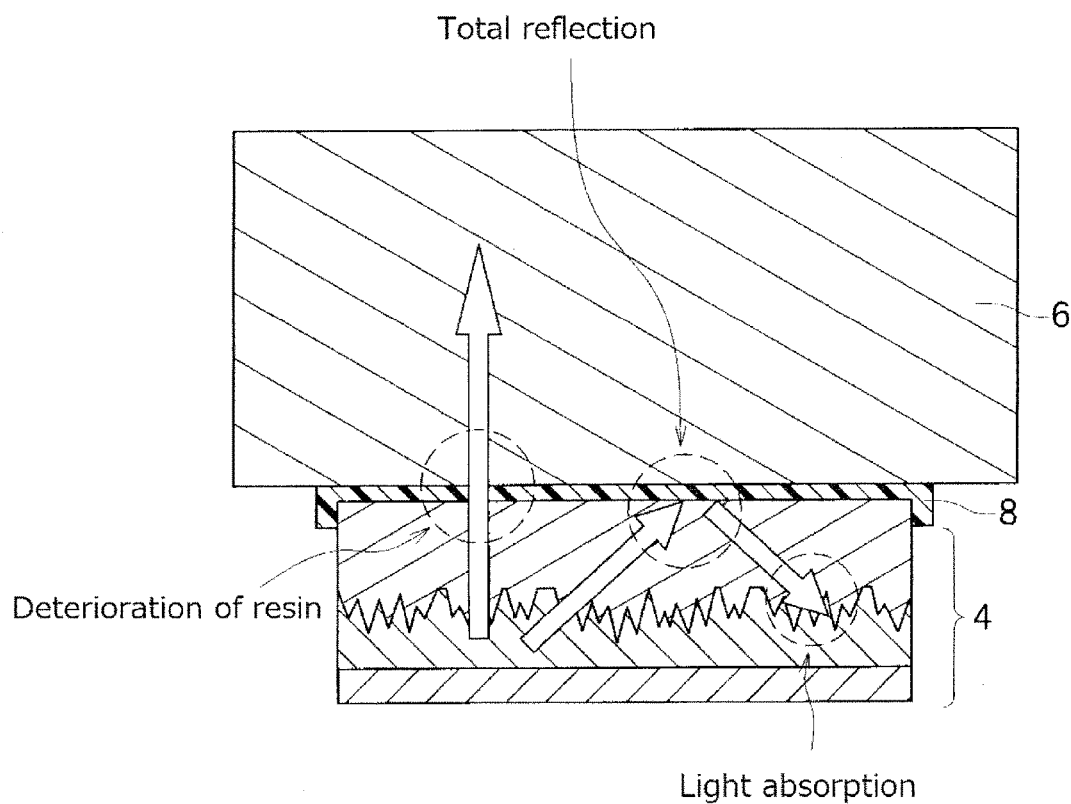

The light emitting device according to the present embodiment is a preferred one in the view of the quality control, the manufacturing process, the product quality and the product reliability. In the light emitting device 1, when the first light transmissive layer 5 and the optical member 6 are bonded using the resin 8 such as the adhesive agent or the like, there is a possibility that the adhesive agent 8 hangs down or spills over from the edge portion of the bonding surfaces, as illustrated in FIG. 4. If the adhesive agent 8 hangs down, the characteristic of the products cannot be stabilized. Therefore, the device or the process for removing the adhesive agent 8 which hangs down is required for the quality control. If the adhesive agent 8 spills over and then hangs down beyond the lowest part of the dice (the light emitting element 4) to reach the mounting part of the dice, there is a risk that the mounting strength, thus the reliability of products will be adversely affected. In the light emitting device 1 according to the present embodiment, since the first light transmissive layer 5 and the optical member 6 are directly bonded without using the adhesive agent, the inconvenience caused by the hanging of adhesive agent is avoided. Accordingly, the light emitting device 1 of the present embodiment is a preferred one in the view of the quality control and the manufacturing process, and the product quality and the product reliability can be enhanced.

Figure 5:
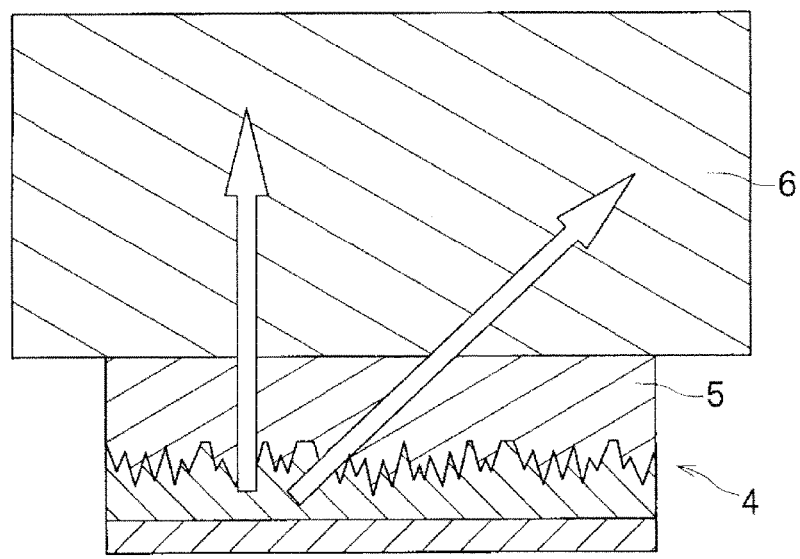
FIG. 5 is a schematic sectional view describing a phenomenon observed when a light emitting element and an optical member are directly bonded.
Figure 6:
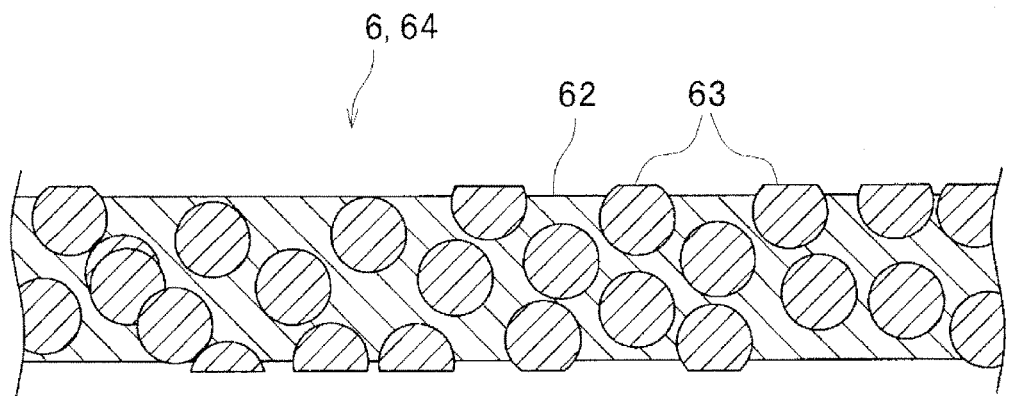
FIG. 6 is a schematic sectional view describing an optical member formed of a non-uniform material.

In the light emitting device 1, since the first light transmissive layer 5 and the optical member 6 are directly bonded, it is possible to produce a dice which has a thickness exceeding the thickness capable of being divided by scribing or the dicing. In addition, for example, if the light emitting device 1 is used as an ultraviolet (UV) LED, the deterioration of the resin 8 (such as an adhesive agent) is never caused by the ultraviolet light (see FIGS. 4 and 5), and thereby enhancing the reliability of products. Since the UV LED often emits a light from the light emitting element to the air directly, the total reflection likely to occur at the boundary face which contacts the air, and thereby extremely lowering the light extracting efficiency. In the light emitting device of the present embodiment, however, since the first light transmissive layer 5 and the optical member 6 that is directly bonded thereto cover the light emitting element 4, the device 1 has a construction like a light emitting diode provided with a resin mold. Therefore, the present embodiment gives a UV LED which significantly enhances the light extracting efficiency in comparison with a UV LED which emits ultraviolet light to the air directly.

A description will be continued with going back to FIG. 1. In order to bond the first light transmissive layer 5 and the optical member 6 well, it is required that both the upper surface of the first light transmissive layer 5 (that is, the principal surface which is exposed after the layer 5 is formed) and the surface of the optical member 6 which is to be bonded to the first light transmissive layer 5 are flat. If the flatness of these surfaces is not enough, the above-mentioned direct bonding cannot be performed. In the case where the flatness of these surfaces is low, a void (that is, a layer of an air whose refract index is low) is generated at the interrace therebetween, and thereby lowering light extracting efficiency even if these surfaces are directly bonded. The bonding surfaces of the first light transmissive layer 5 and the optical member 6 become flat surfaces by the bonding of flat surfaces.

Both the upper surface (the light emitting surface 51) of the first light transmissive layer 5 and the surface 61 of the optical member 6 preferably have a flatness such that the arithmetic average roughness Ra is 1 nm or less. In order to obtain such flatness, for example, a flattening process using the CMP (Chemical Mechanical Polishing) method may be applied to the light emitting surface 51 of the first light transmissive layer 5 and/or the surface 61 of the optical member 6. The arithmetic average roughness Ra can be determined according to the JIS B 0601-2001.

(Optical Member)

The optical member 6 is, as mentioned above, provided on the light emitting surface 51 of the first light transmissive layer 5, and preferably bonded to the light emitting surface 51 by the direct bonding. The direct bonding is preferably performed with the normal temperature bonding method. The optical member 6 has a function to exert a predetermined effect on a light emitted from the light emitting surface 51 of the first light transmissive layer 5. Examples of such an optical member 6 include a fluorescent plate, a sapphire substrate, a GaN substrate, a lens and the like, but not limited thereto. A material of the optical member 6 is not limited particularly as long as it has a light transmissive property relative to the wavelength of the light emitted from the light emitting element 4.

In the case of using the fluorescent plate as the optical member 6, a fluorescent material is included in the optical member 6. The fluorescent material absorbs at least a part of the light extracted from the semiconductor stack 3, and converts the wavelength thereof to a light having a different wavelength. Since color of the light obtained by combining the light emitted from the semiconductor stack 3 and the light emitted from the fluorescent material becomes the color of the light emitted from the light emitting device 1, the fluorescent material or the like is selected in order to obtain a light of desired color tone. The fluorescent material may be at least one selected from the group consisting of an oxide, a nitride, an oxynitride and the like for general use. Examples of such fluorescent material include a YAG-based fluorescent material in which YAG (Yttrium-Aluminum- Garnet) is activated by Ce or the like, and a nitride-based fluorescent material and an oxide-based fluorescent material which are activated by a lanthanides elements such as Eu, Ce and the like. The fluorescent plate may be formed of an inorganic material such as glass or the like which is sintered together with the fluorescent material.

In the case of using the sapphire substrate as the optical member 6, the sapphire substrate may be a flat plate member. In the case of using the GaN substrate as the optical member 6, a GaN substrate may be a flat plate member. If any of these substrates is bonded to the first light transmissive layer 5, a thickness of the light propagating layer in the light emitting device 1 can be increased. Accordingly, the number of the multiple reflections of the light can be reduced in the light emitting device 1, and thereby suppressing the light containment and the light absorption.

The refractive index of the optical member 6 is preferably at the same level or the same as the refractive index of the first light transmissive layer 5. If the refractive index of the optical member 6 exceeds 2.0, there is a case that it is difficult to enhance the light extracting efficiency since a light tends to be absorbed more.

Figure 8:
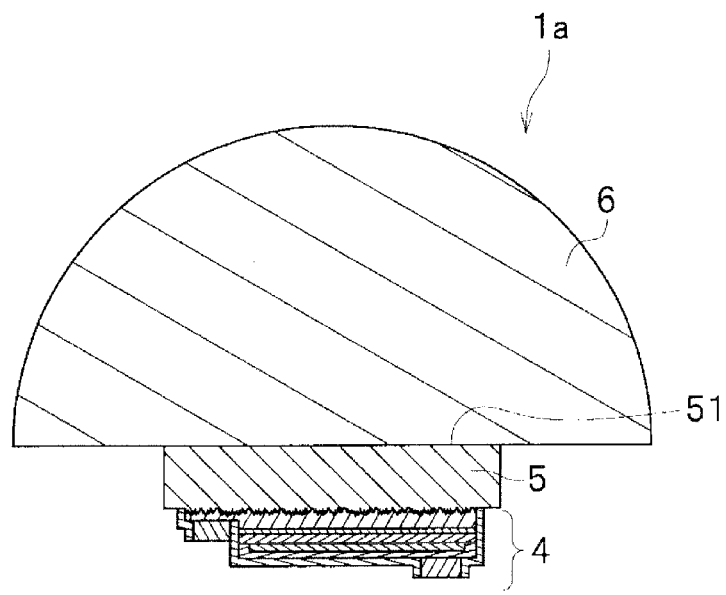
FIG. 8 is a schematic sectional view of a light emitting device according to a variation of the embodiment of the present invention.

In the case of using the lens as the optical member 6 (refer to FIG. 8 as described below), the lens may be formed of sapphire, GaN, a glass, a resin or the like, and may include a fluorescent material. By using the lens as the optical member 6, it can refract a light, and thereby concentrating or diffusing the light. The lens may be a convex lens as illustrated in FIG. 8, or may be a concave lens.

If the optical member 6 is formed with using a material which is not homogeneous such as a fluorescent plate 64 in which a fluorescent material 63 is included in an inorganic material 62 such as glass or the like, there is a case that it is difficult to make the arithmetic average roughness Ra 1 nm or less in spite of using the CMP method or the like. This is because a polishing rate is different according to a component of the material.

Figure 7:
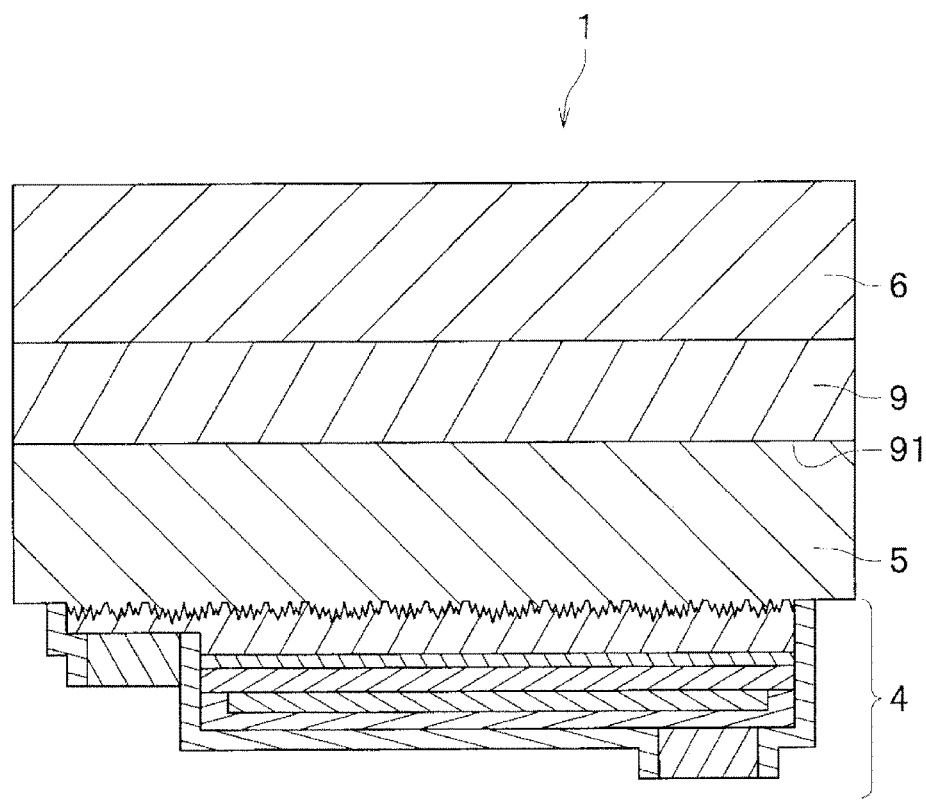
FIG. 7 is a schematic sectional view of a light emitting device according to another embodiment of the present invention.

Accordingly, the following is preferable in the case of using the optical member 6 as mentioned above. For example, as illustrated in FIG. 7, it is preferable to provide a second light transmissive layer 9 having a flat surface 91 on the surface of the optical member 6 which faces the first light transmissive layer 5. The second light transmissive layer 9 may be formed similarly to the first light transmissive layer 5. Thus, the second light transmissive layer 9 may be formed of, for example, at least one inorganic dielectric material selected from the group consisting of $SiO_2$, SiON, $TiO_2$ and $Al_2O_3$, or an organic-inorganic hybrid material including, as an inorganic component, at least one selected from the group consisting of $SiO_2$, SiON, $TiO_2$ and $Al_2O_3$.

In the case of providing the second light transmissive layer 9, the surface 91 which becomes the bonding surface after being bonded to the first light transmissive layer 5 has preferably a flatness such that the arithmetic average roughness Ra is 1 nm or less, as well as the light emitting surface 51 of the first light transmissive layer 5. The first light transmissive layer 5 and the second light transmissive layer 9 which have such flat surfaces may be directly bonded by the normal temperature bonding method or the like. Such flatness can suppress generation of the void at the interface between the first light transmissive layer 5 and the second light transmissive layer 9. In the case of providing the second light transmissive layer 9 on the optical member 6, since the void is hardly formed at the interface between the second light transmissive layer 9 and the optical member 6, the light emitting device 1 with very few voids over its entirety can be obtained as a result. Therefore, in the case of using the second light transmissive layer 9, the total reflection due to the void can be suppressed in the light emitting device 1, and thereby enhancing the light extracting efficiency.

Since the second light transmissive layer 9 may be formed of the material which is similar to that of the first light transmissive layer 5, the refractive index of the second light transmissive layer 9 can be at the same level or the same as the refractive index of the first light transmissive layer 5. Accordingly, the total reflection is hardly generated at the interface between the first light transmissive layer 5 and the second light transmissive layer 9, and therefore the light extracting efficiency is not lowered. Further, when the first light transmissive layer 5 and the second light transmissive layer 9 are formed of the same material, the total reflection due to the difference of the refractive index of the material can be prevented, and the thickness of the light propagating layer can be increased. Therefore, the use of the second light transmissive layer 9 can give the light emitting device 1 in which the light extracting efficiency is enhanced, even if the surface of the optical member 6 is not flat. Since the first light transmissive layer 5 and the optical member 6 are integrated by the direct bonding also in the light emitting device 1 having the second light transmissive layer 9, the bonding strength thereof is high and the effect of enhancing the reliability can be obtained by avoiding the use of the adhesive agent.

The first light transmissive layer 5 and the second light transmissive layer 9 are preferably bonded by the direct bonding because of the same reason as described relating to the bonding between the first light transmissive layer 5 and the optical member 6, and more preferably by the surface-activated bonding, the atomic diffusion bonding or the hydroxyl bonding.

The light emitting device 1 having the above-described construction can emit a light by recombination of electrons provided by the n-side electrode 2n and the n-type semiconductor layer 31, and positive holes provided by the p-side electrode 2p and the p-type semiconductor layer 33 in the active layer 32. The semiconductor stack 3 has the light extracting surface 41 from which a light can be extracted. The light extracted from the light extracting surface 41 of the semiconductor stack 3 propagates in the first light transmissive layer 5, and is emitted from the light emitting surface 51 located at the opposite side. The light emitted from the light emitting surface 51 enters the optical member 6 and then is emitted to the outside of the light emitting device 1. In the light emitting device 1 according to the present embodiment, since the light emitting surface 51 of the first light transmissive layer 5 and the bonding surface 61 of the optical member 6 are flat and both surfaces are directly bonded, there can be suppressed the total reflection which is generated due to the difference in the refractive index between the adhesive agent and the semiconductor, or due to the void. As a result, the light extracting efficiency of the light emitting device 1 can be enhanced. Specifically, when the light emitting surface 51 of the first light transmissive layer 5 and the surface 61 of the optical member 6 are flattened respectively and directly bonded, the light extracting efficiency can be enhanced by 10% in comparison with the case that the first light transmissive layer 5 and the optical member 6 are adhered with using a silicone resin (refractive index n=1.53).

(Variation of Light Emitting Device)

As mentioned above, in the light emitting device 1 as described mainly referring to FIG. 1, the plate-like member (for example, the fluorescent plate or the like) is bonded as the optical member 6 onto the light emitting surface 51 of the first light transmissive layer 5. In the following description, as a variation, a light emitting device using another optical member is described. The same reference numbers will be applied to the members or elements which have already been described, and further description thereof will be omitted.

As illustrated in FIG. 8, in a light emitting device 1a of a variation of the present embodiment, a lens is bonded as an optical member 6 onto the light emitting surface 51 of the first light transmissive layer 5. As mentioned above, in the light emitting device 1a, a light emitted from the light emitting surface 51 of the first light transmissive layer 5 can be concentrated or diffused by the lens.

Figure 9:
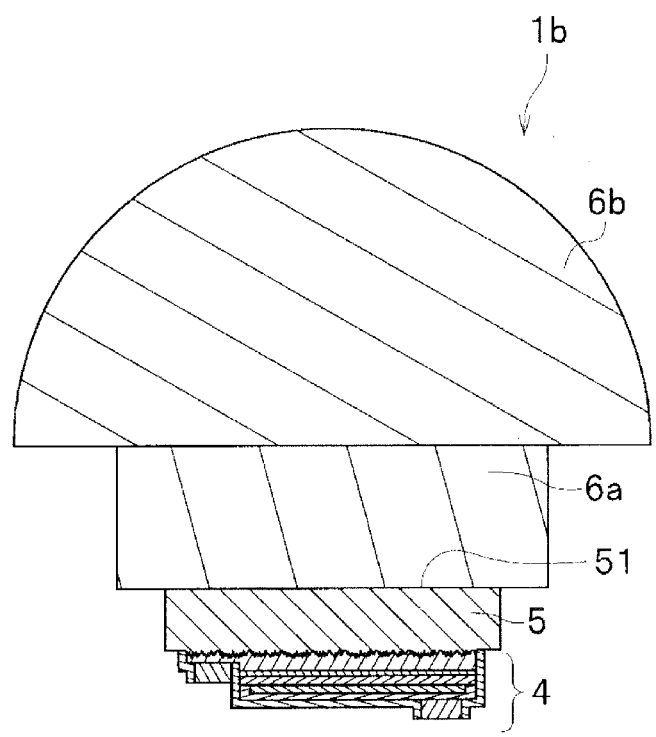
FIG. 9 is a schematic sectional view of a light emitting device according to a variation of the embodiment of the present invention.

As illustrated in FIG. 9, in a light emitting device 1b of another variation of the present embodiment, a fluorescent flat plate 6a, as an optical member 6, is bonded onto the light emitting surface 51 of the first light transmissive layer 5, and a lens 6b is further bonded, as the optical member 6 onto the fluorescent flat plate 6a. In the light emitting device 1b, a light having desired color tone can be obtained by the fluorescent flat plate, and the light of the desired color tone can be concentrated or diffused by the lens. In the embodiment as illustrated in FIG. 9, the bonding of the fluorescent flat plate 6a or the like and the lens 6b may be made by the direct bonding, or by another means such as using the adhesive agent or the like. Heating may be optionally performed during the bonding.

(Light Emitting Device According to Another Embodiment)

Figure 10:
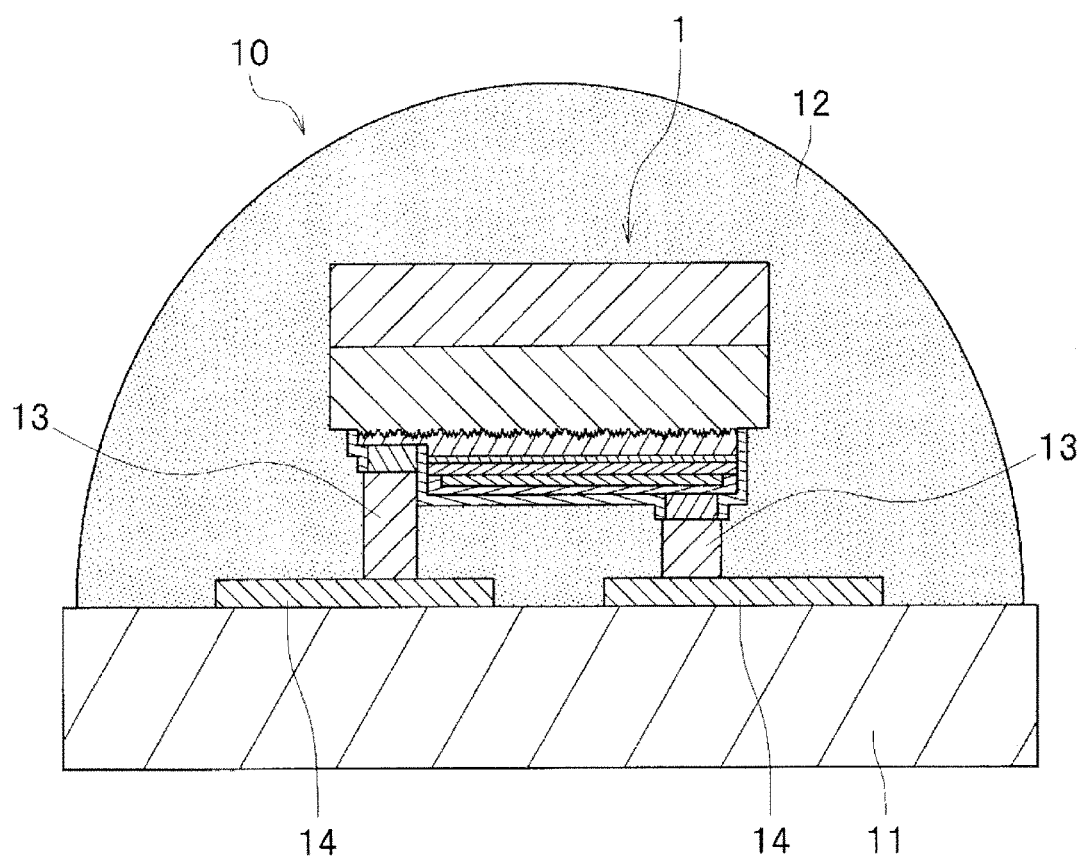
FIG. 10 is a schematic sectional view of a light emitting device according to a further embodiment.

Next, a light emitting device according to another embodiment is described with referring to FIG. 10. The light emitting device as illustrated in FIG. 10 is one aspect of the light emitting device, for example, used for a back light of a liquid crystal display, an outdoor full color display, a toy, a general lighting, a light source for optical communication and the like. In the following description, the light emitting device according to the present embodiment is called "a light source device 10" for convenience of the explanation.

As illustrated in FIG. 10, the light source device 10 is provided with a light emitting device 1 mounted on a mounting substrate 11, a sealing member 12 which seals the light emitting device 1. The light emitting device 1 is configured in the same manner as that described with referring to FIG. 1.

The light emitting device 1 is mounted on the mounting substrate 11 by connecting each of electrodes of the light emitting device 1 (an n-side electrode 2n and a p-side electrode 2p) to a wiring 14 of the mounting substrate 11 via a bump 13.

The mounting substrate 11 may be a conventional substrate used for mounting of an LED, and not limited particularly as long as it enables the LED to be mounted thereon.

The sealing member 12 may be formed of, for example, a material selected form the resin material such as epoxy resin and silicone resin, and an inorganic material such as glass. A method to seal the light emitting device 1 is not limited particularly. For example, the sealing member 12 may be formed with using a compression molding method or a transfer molding method, which uses a metal mold. Alternatively, a potting method may also be applied in which a bank is provided at any part (for example, at an outer edge) of the mounting substrate 11 and a material for the sealing member 12 which has an adequate viscosity is dropped thereon. The sealing member 12 preferably has a light transmissive property relative to the light emitted by the light emitting device 1, and if necessary, it may include a light diffusing element, a heat conductive element or a fluorescent material which converts wavelength of the light.

The bump 13 may be, for example, a plated bump such as an Au bump, a solder bump, a Cu pillar bump and the like, an Au stud bump, a solder printed bump or the like.

As described above, the light emitting device 10 of the present embodiment is provided with the light emitting device 1 as mentioned above. In the light emitting device 1, as mentioned above, since the light emitting surface 51 of the first light transmissive layer 5 and the surface 61 of the optical member 6 are flat and thereby forming the flat bonding surfaces, there can be suppressed the total reflection which is generated due to the difference in refractive index between the adhesive agent and the semiconductor, or due to the void. Consequently, the light extracting efficiency can be enhanced also in the case of the light emitting device 10 wherein the light emitting device 1 is employed.

[Manufacturing Method of Light Emitting Device]

A method for manufacturing a light emitting device according to an embodiment of the present invention (hereinafter it may simply be called "a manufacturing method") will be described with referring to FIG. 11 and FIGS. 12A to 12K.

The manufacturing method according to the present embodiment is a manufacturing method of a light emitting device in which an optical member 6 is provided on a light extracting surface 41 side of a light emitting device 4 via a first light transmissive layer 5.

Figure 11:
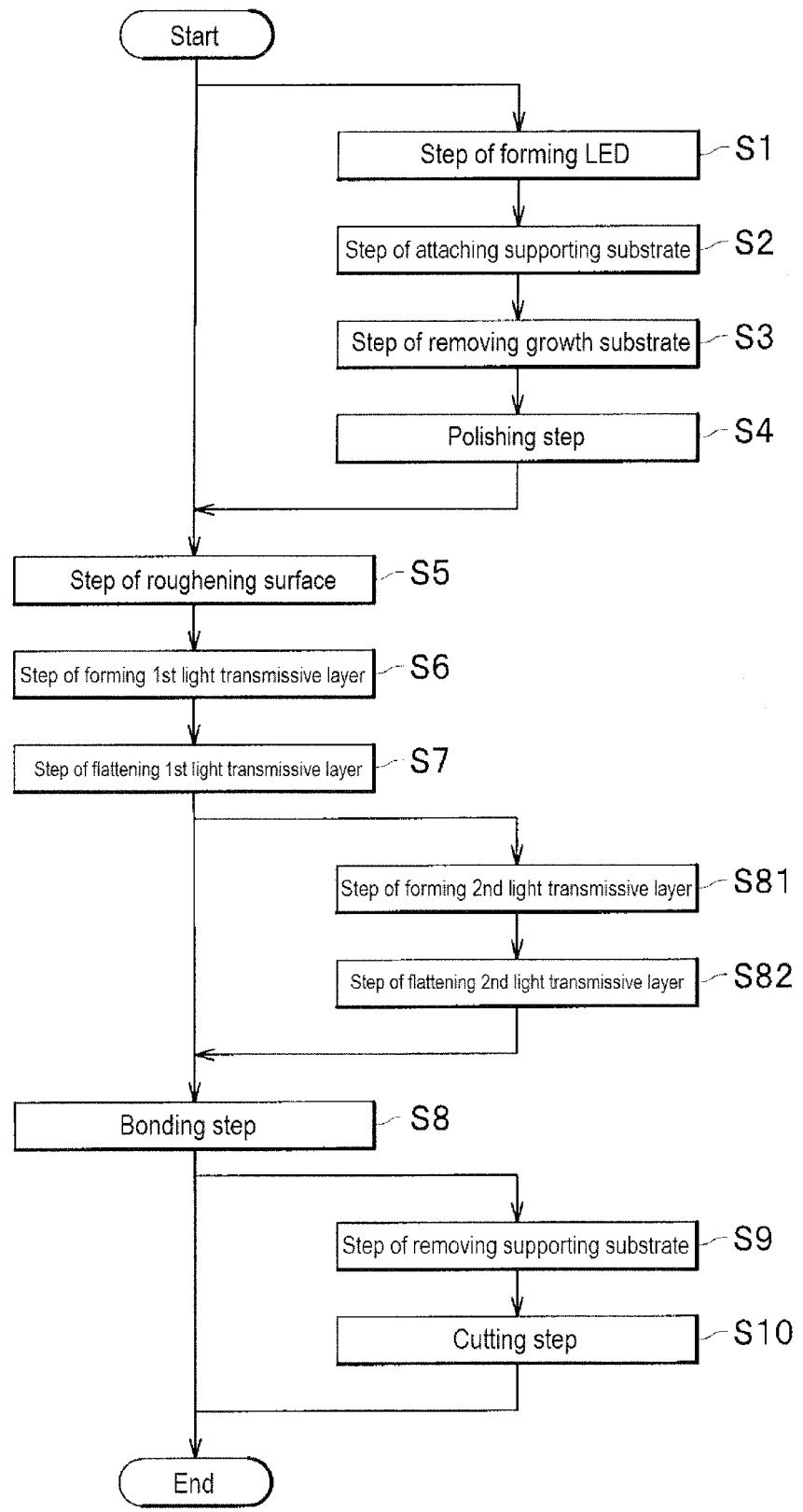
FIG. 11 is a flowchart describing a method for manufacturing a light emitting device according to an embodiment of the present invention.

As illustrated in FIG. 11, a minimum configuration of the manufacturing method of the present embodiment consist of a step of roughening a surface S5, a step of forming a first light transmissive layer S6, a step of flattening a first light transmissive layer S7, and a bonding step S8. In this manufacturing method, the above-mentioned steps are performed in the above-mentioned order to manufacture the above-mentioned light emitting device 1.

In a manufacturing method according to a more detailed and preferable embodiment, a step of forming an LED S1, a step of attaching a supporting substrate S2, a step of removing a growth substrate S3, and a polishing step S4 are performed. Subsequently to the steps S1 to S4, the above-mentioned steps from the step of roughening a surface S5 to the bonding step S8 are performed, followed by a step of removing a supporting substrate S9 and a cutting step S10.

In FIGS. 12A to 12D, the preceding steps which are performed before the step of roughening a surface S5, are illustrated. In FIGS. 12E to 12I, the steps from the step of roughening a surface S5 to the bonding step S8 are illustrated. In FIG. 12J, the step of removing a supporting substrate S9 is illustrated, and in FIG. 12K, the cutting step S10 is illustrated.

The more detailed and preferable embodiment of the manufacturing method will be described with referring to FIGS. 12A to 12K together with FIG. 11. It goes without saying that the minimum configuration of the manufacturing method is included in the detailed embodiment. Therefore, the detailed embodiment will be herein after described in place of the explanation of the minimum configuration of the manufacturing method.

The steps from the step of forming an LED S1 to the polishing step S4 which are performed before the step of roughening a surface S5, are steps of obtaining the light emitting element 4 in which the light extracting surface 41 is flattened, which becomes the object to be roughened at the step of roughening a surface S5. Since these steps are general steps for manufacturing a light emitting element, the contents will be described briefly with referring to FIG. 11 and FIGS. 12A to 12D.

(Step of Manufacturing LED)

Figure 12A:
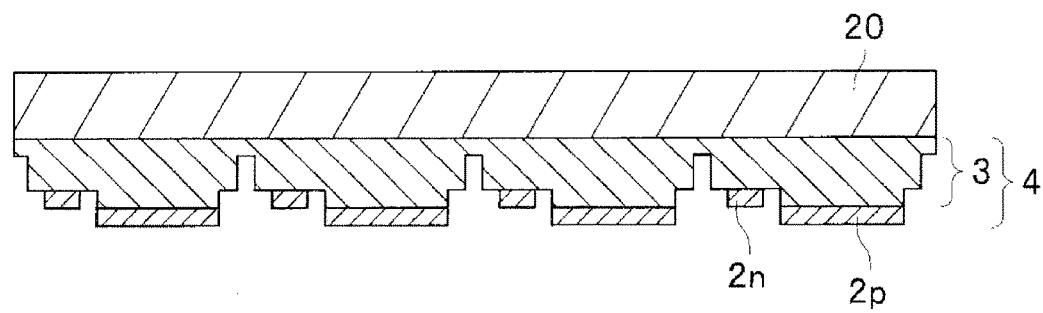
FIG. 12A is a schematic sectional view describing a step of forming an LED, which is included in a method for manufacturing a light emitting device according to an embodiment of the present invention.

As illustrated in FIG. 11 and FIG. 12A, the step of manufacturing an LED S1 is a step where the semiconductor stack 3 is formed by laminating the n-type semiconductor layer 31, the active layer 32 and the p-type semiconductor layer 33 (all of them are not shown in FIG. 12A. see FIG. 1) in this order on a growth substrate 20, and then predetermined electrodes are formed thereon.

In the specific description with referring to FIG. 1, the n-type semiconductor layer 31, the active layer 32 and the p-type semiconductor layer 33 are laminated sequentially on the growth substrate 20. Subsequently, photolithography and etching are performed for removing a part of the p-type semiconductor layer 33, the active layer 32 and the n-type semiconductor layer 31, whereby the n-type semiconductor layer 31 is exposed at the position where the n-side electrode 2n is to be formed and a concave portion for separation of the light emitting element is formed. Then, the n-side electrode 2n is formed on the bottom surface of the exposed n-type semiconductor layer 31. The p-side electrode 2p is formed on a predetermined position of the p-type semiconductor layer 33. It is preferable to form the protecting layer 7 during this step. A sapphire substrate or the like may preferably be used as the growth substrate 20. It is preferable to measure the characteristics of the LED at this moment.

(Step of Attaching a Supporting Substrate)

Figure 12B:
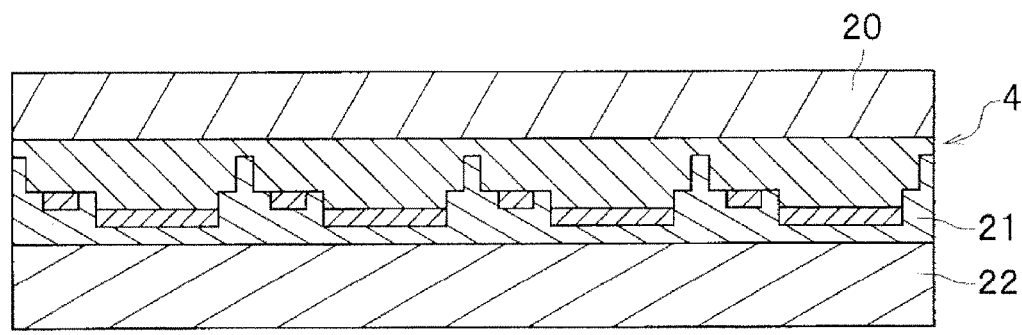
FIG. 12B is a schematic sectional view describing a step of attaching a supporting substrate, which is included in the method for manufacturing a light emitting device according to the embodiment of the present invention.

Next, as illustrated in FIGS. 11 and 12B, the step of attaching a supporting substrate S2 is a step wherein a substrate for support (a supporting substrate 22) is attached with using a resin 21 onto the side where the n-side electrode 2n and the p-side electrode 2p are formed.

The supporting substrate 22 may be, for example, a carrier plate of sapphire or a carrier plate with a through-hole.

It is preferable that the resin 21 may be removed by the wet process (the wet etching) or the dry process (the dry etching), and have high resistance properties against high temperature, or against acid and alkalis. As such resin material, for example, a polyimide-based resin may be exemplified.

(Step of Removing a Growth Substrate)

Figure 12C:
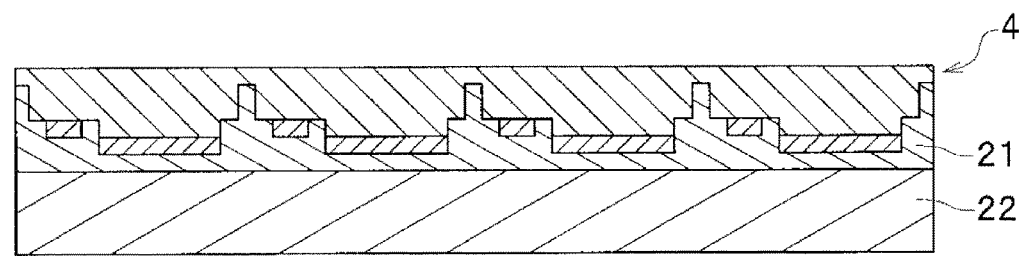
FIG. 12C is a schematic sectional view for describing a step of removing a growth substrate, which is included in the method for manufacturing a light emitting device according to the embodiment of the present invention.

As illustrated in FIGS. 11 and 12C, the step of removing a growth substrate S3 is a step wherein the growth substrate 20 (not illustrated in FIG. 11C. see FIG. 12B) is removed from the light emitting element 4 formed on the growth substrate 20.

The growth substrate 20 may be removed by a method wherein a laser light with the wavelength that is absorbed by the material (for example, GaN or the like) which forms n-type semiconductor layer 31, is applied from the side of the growth substrate 20 (a laser lift off (LLO)). Since the light emitting device 1 according to the present disclosure is of a configuration having no growth substrate 20, it is not necessary to take care of the light (a blue light in the case of blue LED) emitted from the side surface of the growth substrate 20.

(Polishing Step)

Figure 12D:
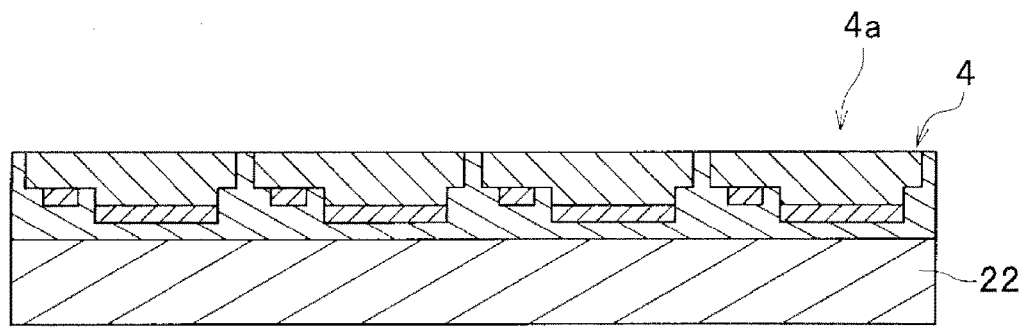
FIG. 12D is a schematic sectional view describing a polishing step, which is included in the method for manufacturing a light emitting device according to the embodiment of the present invention.

Next, as illustrated in FIGS. 11 and 12D, the polishing step S4 is performed. The polishing step S4 is a step wherein a stripped surface 4a of the light emitting element 4, which surface is exposed by the removal of the growth substrate, is polished. In the present embodiment, the polishing is performed for the separation of the light emitting element 4 (more specifically, the semiconductor layers) at the concave portion formed during the LED forming step. The polishing is performed such that the bottom of the concave portion is removed by polishing.

Such polishing process may be performed, for example, by the CMP method, or by using a grinder and a polisher. If the light emitting device 1 to be manufactured is used for an ultraviolet LED, it is preferable to remove an initial growth layer of the semiconductor stack 3, which absorbs an ultraviolet light.

At the stage when the above-mentioned step of removing a growth substrate S3 is completed, separation between the chips has not been performed. Therefore, if the separation is necessary, a chipping process may be performed after this polishing step S4 is completed. The chipping process may be performed by scribing or by dicing.

When the above-mentioned steps are performed, the stripped surface 4a which is polished (this surface corresponds to the light extracting surface 41 of the light emitting element 4) is to be roughened (see FIG. 11 and FIG. 12E) in the step of roughening a surface S5 as described below, (Step of Roughening a Surface)

Figure 12E:
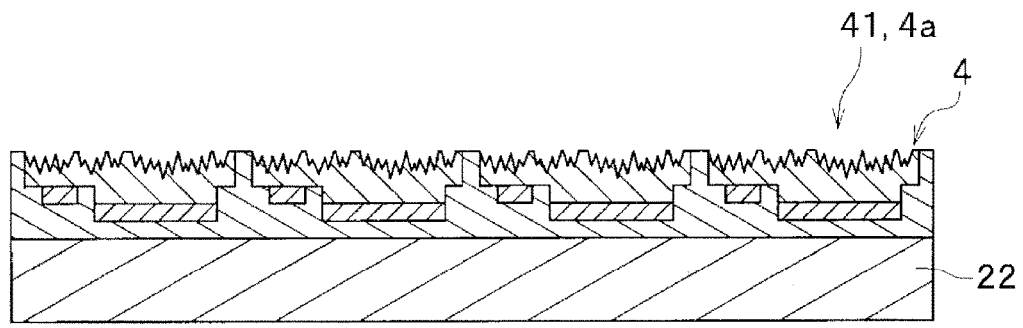
FIG. 12E is a schematic sectional view describing a step of roughening a surface, which is included in the method for manufacturing a light emitting device according to the embodiment of the present invention.

As illustrated in FIGS. 11 and 12E, the step of roughening a surface S5 is a step wherein the light extracting surface 41 of the light emitting element 4 is roughened.

In the step of roughening a surface S5, a predetermined process is performed to the light emitting element 4 having the light extracting surface 41 which is to be flattened (or the stripped surface 4a which has been polished in the polishing step S4).

The predetermined process is, for example, the wet process (the wet etching) with using an alkaline solution, the dry process (the dry etching) or the like. According to these processes, the light extracting surface 41 of the light emitting element 4 can be roughened in the self-organizing manner. The step of roughening a surface is not limited to those, but it may be, for example, a process employing a grinder and/or a polisher. Alternatively, the step of roughening a surface S5 may be a step of forming dotted patterns or line and space patterns by the photolithography and the etching and so on. Alternatively, the step of roughening a surface S5 may be a step wherein the step of forming dotted patterns or line and space patterns and the wet process or the dry process are combined.

(Step of Forming a First Light Transmissive Layer)

Figure 12F:
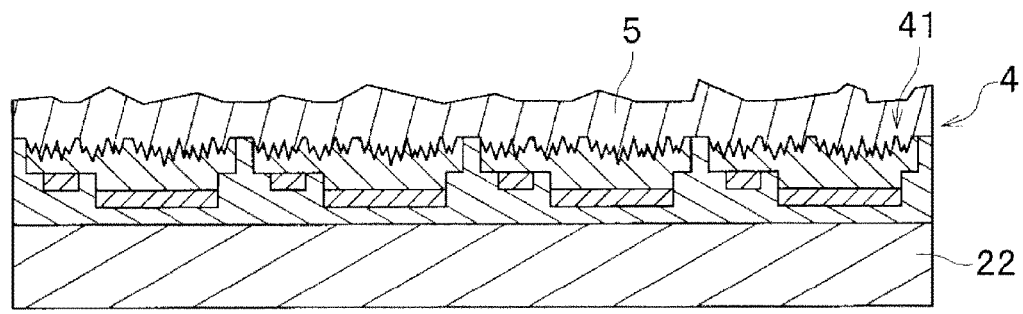
FIG. 12F is a schematic sectional view describing a step of forming a first light transmissive layer, which is included in the method for manufacturing a light emitting device according to the embodiment of the present invention.

As illustrated in FIGS. 11 and 12F, the step of forming a first light transmissive layer S6 is a step wherein the first light transmissive layer 5 is formed on the light extracting surface 41 which has been roughened.

As mentioned above, the first light transmissive layer 5 is formed of, for example, an inorganic dielectric material, or an organic-inorganic hybrid material. A forming method of the first light transmissive layer 5 may be selected from the CVD, the sputtering, the vapor deposition, the ALD, the sol-gel process, the in-situ polymerisation process, the solid-phase reaction method and so on, depending on the materials.

(Step of Flattening a First Light Transmissive Layer)

Figure 12G:
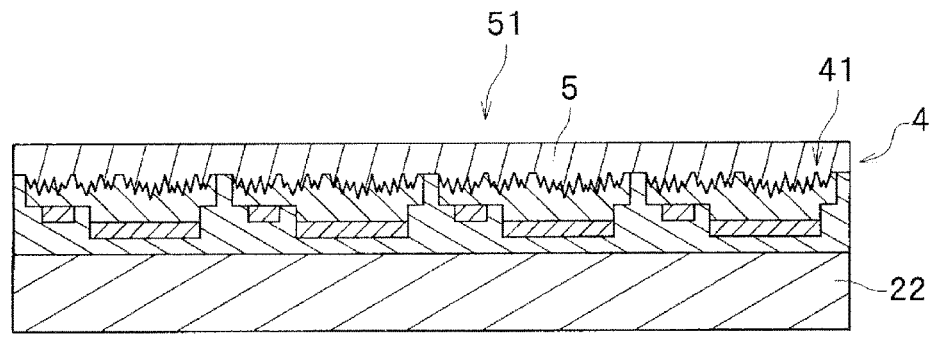
FIG. 12G is a schematic sectional view describing a step of flattening a first light transmissive layer, which is included in the method for manufacturing a light emitting device according to the embodiment of the present invention.

As illustrated in FIGS. 11 and 12G, the step of flattening a first light transmissive layer S7 is a step wherein the upper surface of the first light transmissive layer 5 is flattened. The upper surface of the first light transmissive layer 5 flattened in this step becomes the light emitting surface 51.

The flattening of the upper surface of the first light transmissive layer 5 may be performed, for example, by the CMP method. The flattening process is preferably performed such that the arithmetic average roughness Ra becomes 1 nm or less.

Figure 12H:
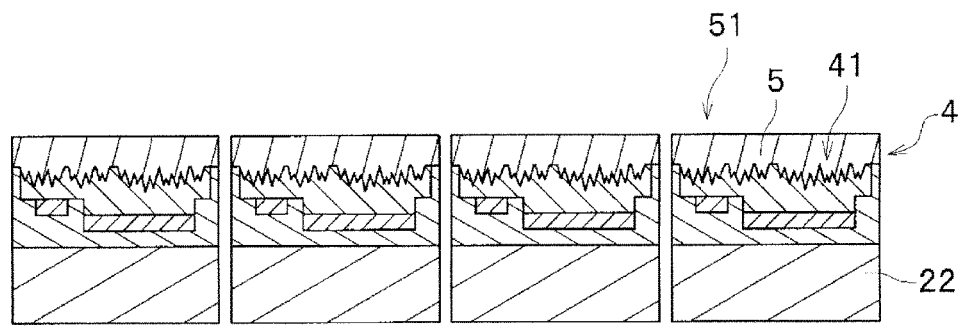
FIG. 12H is a schematic sectional view describing a chipping step performed after the step of flattening a first light transmissive layer, which is included in the method for manufacturing a light emitting device according to the embodiment of the present invention.

If the chipping needs to be performed before the bonding step S8, the chipping process may be performed after the step of flattening a first light transmissive layer S7 is completed (see FIG. 12H). The chipping process may be performed, for example, by the scribing or by the dicing.

(Bonding Step)

Figure 12I:
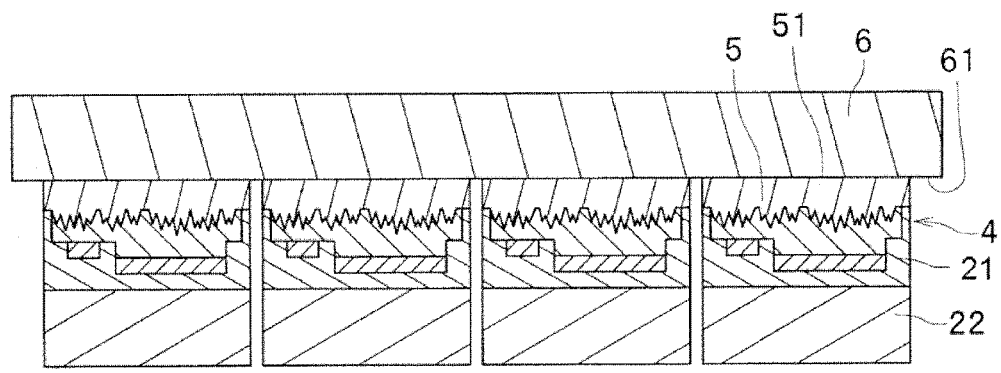
FIG. 12I is a schematic sectional view describing a bonding step, which is included in the method for manufacturing a light emitting device according to the embodiment of the present invention.
Figure 12J:
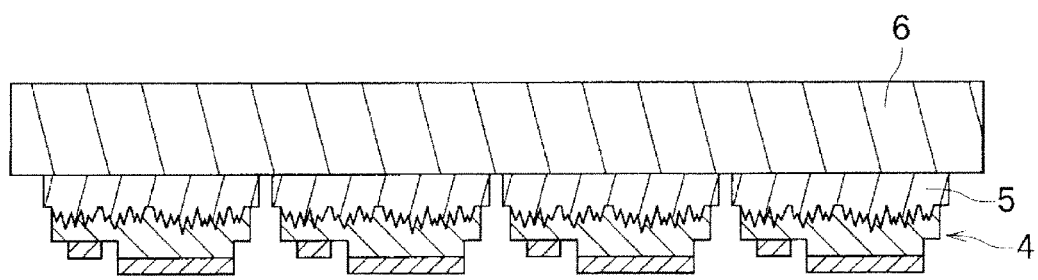
FIG. 12J is a schematic sectional view describing a step for removing a supporting substrate, which is included in the method for manufacturing a light emitting device according to the embodiment of the present invention.

As illustrated in FIGS. 11 and 12I, the bonding step S8 is a step of bonding the upper surface (the light emitting surface 51) of the first light transmissive layer 5 which has been flattened, and the surface 61 of the optical member 6 which has been flattened.

It is preferable to flatten the surface 61 of the optical member 6, which surface is to be bonded to the first light transmissive layer 5, before the bonding step S8. If the surface 61 of the optical member 6 is sufficiently flat, it is not necessary to subject the surface 61 to the flattening process. As mentioned above, the arithmetic average roughness Ra of the surface 61 of the optical member 6 is preferably 1 nm or less. Therefore, when the flattening process is performed, the flattening process is preferably performed such that the arithmetic average roughness Ra becomes 1 nm or less.

As mentioned above, it is preferable that the light emitting surface 51 of the first light transmissive layer 5 and the surface 61 of the optical member 6 are directly bonded with using the normal temperature bonding method. Specifically, the direct bonding is preferably performed by the surface-activated bonding, the atomic diffusion bonding, or the hydroxyl bonding.

(Forming Second Light Transmissive Layer on Optical Member)

As mentioned above, there is a case that a material of the optical member 6 is not uniform, and it is difficult to achieve 1 nm or less of the arithmetic average roughness Ra of in the surface 61 even if the CMP method or the like is applied. In this case, a second light transmissive layer 9 in which a surface 91 is flattened, may be formed on the surface 61 of the optical member 6 (refer to FIG. 7), and the optical member 6 may be bonded to the first light transmissive layer 5 via the second light transmissive layer 9.

Specifically, as illustrated in FIG. 11, it is preferable to perform a step of forming the second light transmissive layer S81, and a step of flattening the second light transmissive layer S82 before the bonding step S8 is performed.

(Step of Forming a Second Light Transmissive Layer)

As illustrated in FIG. 11, the step of forming a second light transmissive layer S81 is a step wherein the second light transmissive layer 9 having a light transmissive property is formed on the surface 61 of the optical member 6 which is to face the first light transmissive layer 5.

The second light transmissive layer 9 may be formed of the same material with the same method as those of the first light transmissive layer 5. The forming method of the second light transmissive layer 9 is not limited to the method which is exemplified as that of the first light transmissive layer 5, but it may be, for example, a method wherein the second light transmissive layer 9 which has already been fabricated, is bonded to the optical member 6. Anyhow, since the step of forming the second light transmissive layer S81 is a separate step which is independent of the light emitting element 4, this step may be performed employing conditions suitable for the material without being subjected to limitation of the forming conditions (for example, a temperature or a bonding method). For example, the second light transmissive layer 9 may be formed at a temperature of 400° C. or more, or may be bonded to the optical member 6 at a temperature of 400° C. or more. Alternatively, the second light transmissive layer 9 may be bonded to the optical member 6 with using the electric field.

The surface 61 of the optical member 6 on which the second light transmissive layer 9 is formed, may or may not be subjected to the roughening process or the flattening process. When the surface 61 is roughened, the total reflection can be suppressed, and thereby enhancing the light extracting efficiency. When the refractive index of the optical member 6 and the refractive index of the second light transmissive layer 9 are the same and the surface 61 is flattened, an optical boundary face is not formed, whereby the Fresnel reflection can be suppressed to enhance the light extracting efficiency. When any of those surface treatments is not applied to the surface 61, it can enhance the productivity, and lower the cost to manufacture the light emitting device 1.

(Step of Flattening a Second Light Transmissive Layer)

As illustrated in FIG. 11, a step of flattening a second light transmissive layer S82 is a step wherein a surface 91 of the second light transmissive layer 9 formed on the optical member 6 is flattened.

The second light transmissive layer may be flattened by, for example, the CMP method. It is preferable that the flattening is performed such that the arithmetic average roughness Ra of the surface 91 of the second light transmissive layer 9 becomes 1 nm or less. By flattening the surface 91 of the second light transmissive layer 9, direct bonding can be favorably made between the first light transmissive layer 5 and the second light transmissive layer 9, and the total reflection generated due to the void at the interface between the second light transmissive layer 9 and the first light transmissive layer 5 can be suppressed.

Subsequently, the surface 91 of the second light transmissive layer 9, which surface has been flattened, is brought into contact with the light extracting surface 51 of the second light transmissive layer 5, which surface has been flattened, and then both are bonded together by performing the above-mentioned bonding step S8.

According to this process, there can be obtained the light emitting device 1 which is configured to have the light emitting element 4/the first light transmissive layer 5/the second light transmissive layer 9/the optical member 6.

(Step of Removing a Supporting Substrate)

As illustrated in FIGS. 11 and 12J, the step of removing a supporting substrate S9 is a step to wherein a supporting substrate 22 is removed together with the resin 21 (both are not illustrated in FIG. 12J. see FIG. 12I) from the light emitting element 4 where the optical member 6 is bonded.

For removing the supporting substrate 22, an adequate method may be used according to the resin 21 used. While the step of removing a supporting substrate S9 may be performed at another timing in the manufacturing process, it is preferable to perform this step just before the cutting step S10, considering a strength and handleability of the light emitting element 4 under manufacturing.

(Cutting Step)

Figure 12K:
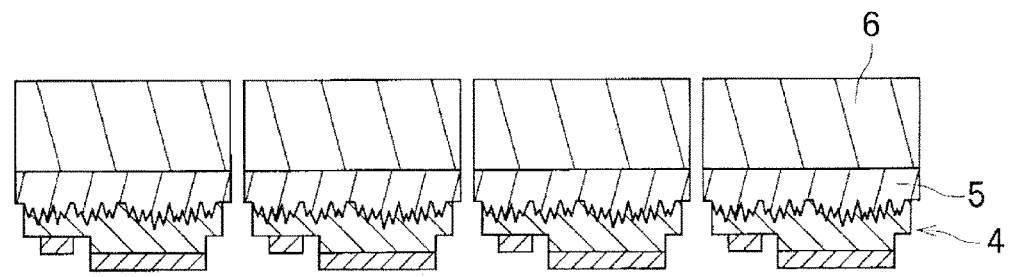
FIG. 12K is a schematic sectional view describing a cutting step, which is included in the method for manufacturing a light emitting device according to the embodiment of the present invention.

As illustrated in FIGS. 11 and 12K, the cutting step S10 is a step wherein the laminated structure in which the supporting substrate 22 has been removed, is cut for chipping to manufacture the light emitting device 1. The chipping may be performed by the scribing or by the dicing. For example, if the chipping of the light emitting element 4 is performed after the step of flattening a first light transmissive layer, only the optical member 6 is separated in the cutting step S10.

In the manufacturing method according to the present embodiment, it is possible to manufacture the light emitting device 1 in which the light extracting efficiency is enhanced, because of the suppression of the total reflection generated due to the difference of the refractive index of the material, and the suppression of the total reflection generated due to the void.

Although the light emitting device and the manufacturing method thereof according to the present disclosure is described above specifically by the embodiment, the spirit of the present invention is not limited to such description, and it should be interpreted widely according to the description of the claims. It goes without saying that various modifications and alternations will be included in the spirit of the present invention.

The present disclosure may be applied to a light emitting device having a high-efficiency LED or an LED that emits an ultraviolet light and a manufacturing method thereof. Such light emitting device may be used for a lighting device, a sterilizing device, a head ramp for vehicles, a display, a device of a sign advertising or the like.

As mentioned above, the light extracting efficiency can be enhanced in the light emitting device according to the embodiment of the present invention since the first light transmissive layer is provided on one surface, specifically on the light extracting surface side of the semiconductor light emitting element, and the bonding surfaces of this first light transmissive layer and the optical member are flat, and the first light transmissive layer and the optical member are directly bonded.

According to the manufacturing method of the light emitting device according to the embodiment of the present invention, the light emitting device in which the light extracting efficiency is enhanced can be manufactured since the first light transmissive layer is formed on the light extracting surface side of the semiconductor light emitting device, and the upper surface of the first light transmissive layer is flattened, and the flattened upper surface and the surface of the optical member are directly bonded.

What is claimed is:

1. A light emitting device comprising:
   a semiconductor light emitting element;
   a first light transmissive layer disposed in direct contact with an n-type layer of the light emitting element; and
   an optical member directly bonded to the first light transmissive layer on a light extracting surface side of the semiconductor light emitting element,
   wherein a surface of the n-type layer and a first surface of the first light transmissive layer, at which the first light transmissive layer is in direct contact with the n-type layer, are roughened surfaces,
   wherein a second surface of said first light transmissive layer and a surface of said optical member, at which the optical member is bonded to the first light transmissive layer, are flat,
   wherein said first light transmissive layer is formed of a material consisting essentially of Si, O, and N,
   wherein a difference between a refractive index of the first light transmissive layer and a refractive index of the optical member is in a range of ±0.3 based on absolute values of the refractive indexes of the first light transmissive layer and the optical member,
   wherein a thickness of the first light transmissive layer is in a range of 100 nm to 1000 nm, and
   wherein the optical member is inhomogeneous and comprises an inorganic material and fluorescent material particles, and wherein a first plurality of the fluorescent material particles partially protrude from the inorganic material, and a second plurality of the fluorescent material particles are entirely embedded in the inorganic material.

2. The light emitting device according to claim 1, wherein an arithmetic average roughness Ra of both of said second surface of said first light transmissive layer and said surface of said optical member is 1 nm or less.

3. The light emitting device according to claim 1, wherein a refractive index of said first light transmissive layer is in a range of 1.4 to 2.0.

4. The light emitting device according to claim 1, wherein said optical member is a fluorescent plate, a sapphire substrate, a GaN substrate or a lens.

5. The light emitting device according to claim 1, wherein said direct bonding of said first light transmissive layer and said optical member is performed by surface-activated connection, atomic diffusion bonding or hydroxyl bonding.

6. A light emitting device comprising:
   a mounting substrate;
   the light emitting device according to claim 1, mounted on the mounting substrate; and
   a sealing member sealing said light emitting device.

7. A light emitting device comprising:
   a semiconductor light emitting element;
   a first light transmissive layer disposed in direct contact with an n-type layer of the light emitting element;
   a second light transmissive layer directly bonded to the first light transmissive layer; and
   an optical member disposed in direct contact with the second light transmissive layer on a light extracting surface side of a the semiconductor light emitting element,
   wherein a surface of the n-type layer and a first surface of the first light transmissive layer, at which the first light transmissive layer is in direct contact with the n-type layer, are roughened surfaces, and
   wherein a second surface of said first light transmissive layer and a surface of the second light transmissive layer, at which the second light transmissive layer is bonded to the first light transmissive layer, are flat,
   wherein said first light transmissive layer is formed of a material consisting essentially of Si, O, and N,
   wherein a difference between a refractive index of the first light transmissive layer and a refractive index of the optical member is in a range of ±0.3 based on absolute values of the refractive indexes of the first light transmissive layer and the optical member,
   wherein a thickness of the first light transmissive layer is in a range of 100 nm to 1000 nm, and
   wherein the optical member is inhomogeneous and comprises an inorganic material and fluorescent material particles, and wherein a first plurality of the fluorescent material particles partially protrude from the inorganic material, and a second plurality of the fluorescent material particles are entirely embedded in the inorganic material.

8. The light emitting device according to claim 7, wherein an arithmetic average roughness Ra of said surface of said second light transmissive layer is 1 nm or less.

9. The light emitting device according to claim 7, wherein a refractive index of said first light transmissive layer is in a range of 1.4 to 2.0.

10. The light emitting device according to claim 7, wherein a refractive index of said second light transmissive layer is in a range of 1.4 to 2.0.

11. The light emitting device according to claim 7, wherein the direct bonding of said first light transmissive layer and said second light transmissive layer is performed by surface-activated bonding, atomic diffusion bonding or hydroxyl bonding.

\* \* \* \* \*